USO11963340B2

(12) United States Patent
Gao (10) Patent No.: US 11,963,340 B2
(45) Date of Patent: Apr. 16, 2024

(54) LEAK PROTECTION FOR COLD PLATE LIQUID COOLING (71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 56 days.

(21) Appl. No.: 17/351,878

(22) Filed: Jun. 18, 2021

(65) Prior Publication Data
US 2022/0408613 A1 Dec. 22, 2022

(51) Int. Cl.
H05K 7/20 (2006.01)

(52) U.S. Cl.
CPC ..... *H05K 7/20818* (2013.01); *H05K 7/20254* (2013.01); *H05K 7/20772* (2013.01); *H05K 7/20781* (2013.01); *H05K 7/20809* (2013.01)

(58) Field of Classification Search
CPC ........... H05K 7/20254; H05K 7/20763; H05K 7/20772; H05K 7/20781; H05K 7/20309; H05K 7/20818
See application file for complete search history.

(56) References Cited

U.S. PATENT DOCUMENTS

| 7,298,617 | B2 * | 11/2007 | Campbell | ........... | H01L 23/4338 |
| | | | | | 165/80.4 |
| 7,515,418 | B2 * | 4/2009 | Straznicky | .......... | H01L 23/4338 |
| | | | | | 361/699 |
| 7,971,440 | B2 * | 7/2011 | Chan | ........................ | H01L 23/38 |
| | | | | | 62/3.6 |
| 10,334,763 | B2 * | 6/2019 | Gao | .................... | H05K 7/20218 |
| 10,667,437 | B2 * | 5/2020 | Gao | .................... | H05K 7/20781 |
| 10,736,240 | B2 * | 8/2020 | Gao | .................... | H05K 7/20272 |
| 10,827,649 | B2 * | 11/2020 | Lunsman | ........... | H05K 7/20927 |
| 2013/0299232 | A1 * | 11/2013 | Fitz-Patrick | ....... | H05K 7/20636 |
| | | | | | 174/547 |
| 2016/0150678 | A1 * | 5/2016 | Kim | .................... | H05K 7/20636 |
| | | | | | 361/699 |
| 2019/0348345 | A1 * | 11/2019 | Parida | ..................... | H01L 25/18 |
| 2020/0025641 | A1 * | 1/2020 | Long | .................. | H05K 7/20254 |

* cited by examiner

*Primary Examiner* — Zachary Pape
(74) *Attorney, Agent, or Firm* — WOMBLE BOND DICKINSON (US) LLP (57) ABSTRACT A frame for a liquid-cooled chassis in an IT rack, can include a fluid supply line contained within one or more walls of the frame and a fluid return line contained within the one or more walls of the frame. Fluid distribution function and hardware are integrated to the frame. One or more contact pads can be located on an external surface of the frame, for transferring thermal energy with IT equipment.

17 Claims, 6 Drawing Sheets

FIG. 1

FRONT VIEW
FIG. 2

TOP VIEW
FIG. 3

LEAK PROTECTION FOR COLD PLATE LIQUID COOLING

FIELD

Embodiments of the present disclosure relate generally to leak protection fora cold plate used with an information technology (IT) rack. In particular, a leak-resistant frame can house cold plates that are used in a chassis for liquid-cooled IT equipment such as, for example, a server.

BACKGROUND

Information Technology (IT) includes technology such as computers that are accessible through the internet or a local network, which provide storage of, or access to, data, websites, computer programs, algorithms, services, and more. IT equipment such as servers and other electronic devices (e.g., peripheral devices) can be installed in a chassis. These chassis can then be installed in an IT rack. An IT rack can be populated with a plurality of chassis, each housing IT equipment, as a manner of managing power and thermal requirements of the IT equipment.

A liquid cooling system can transfer and deliver liquid between an IT rack and the chassis, and between the chassis and the IT equipment that is mounted on the chassis. Such a system can provide high operational and cooling efficiency of the IT equipment. Liquid cooling for high power density electronics has increased in popularity because air cooling can be thermally insufficient in some circumstances. Liquid cooling allows for higher packaging density and increased computing load of electronics, by being capable of absorbing greater thermal energy from the electronic equipment.

Liquid cooling systems can be susceptible to fluid leaks, which can damage IT equipment. Within a chassis, fluid can travel through cold plates that can be physically and thermally connected to IT equipment, to keep the IT equipment cool. The fluid can flow to and from the cold plates through various connectors, conduit, adapters, and other hardware, each component introducing an additional point of failure, which can cause damage to the IT equipment given the proximity between the cold plate and the IT equipment. Further, an IT rack can house various groups of computing hardware which can take different form factors.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Liquid cooling systems can circulate fluid to and from IT electronics within an IT rack. An IT rack may include various IT equipment, for example, servers, peripherals, and other electronic computing components. An IT rack may include a manifold that distributes liquid to and from different chassis in an IT rack. Each chassis can include mounting hardware, trays, cooling, power, wire harnessing, and other infrastructure for the IT equipment. Within a chassis, leaks can occur due to the various conduits, connectors, fittings, adapters, and other parts that a cooling fluid travels through in order to transfer thermal energy to and from the IT equipment.

In the present disclosure, a frame can separate components of a liquid cooling system from the electronics of IT equipment at the chassis level. A frame for a liquid-cooled chassis in an IT rack, can include a fluid supply line contained within one or more walls of the frame, and a fluid return line contained within the one or more walls of the frame. One or more contact pads can be located on an external surface of the frame, for transferring thermal energy with the IT equipment. Such a frame can distribute fluid to and from one or more cold plates housed in an internal region of the frame. The frame can provide a water-tight barrier between a) the cold plates, connectors, conduit, or other components that house the cooling fluid, and b) the IT equipment. As such, if a leak occurs from such components, the frame can contain the fluid while the IT equipment can remain dry by fully segregating the leaked fluid from the IT equipment.

Reliability of liquid cooling for an IT rack can be improved in a manner that provides predictable and flexible protection for the IT equipment. Various cold plates can be arranged to fit different arrangements of IT equipment with various form factors using such a frame. Cooling can be distributed to IT equipment such as processors with high power density that require high power density thermal management. Further, such a frame can provide universal protection for one phase or two phase fluid cooling solutions.

Figure 1:
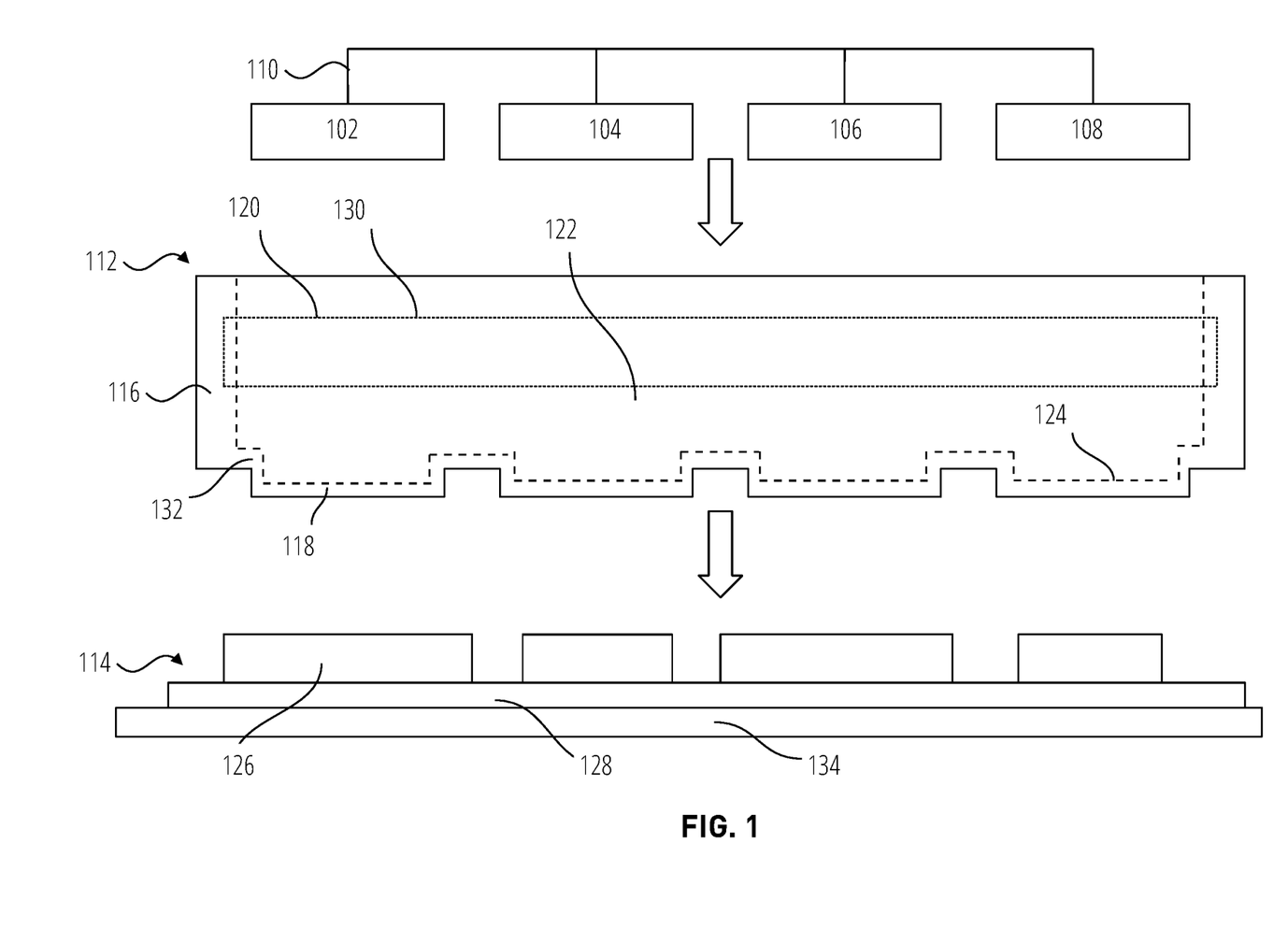
FIG. 1 shows a frame for a liquid-cooled chassis in accordance with some embodiments.

FIG. 1 shows a frame for a liquid-cooled chassis in accordance with some embodiments. A frame 112 for a liquid-cooled chassis in an IT rack, can include a fluid supply line 120 contained within one or more walls of the frame and a fluid return line 130 contained within the one or more walls of the frame. Although the fluid supply line and fluid return line are referenced to the same region in this figure, they are separate fluid lines that are contained with the frame walls. The fluid supply line 120 delivers fluid from an IT rack to one or more cold plates such as 102, 104, 106, and 108. The fluid return line 130 collects the fluid from the one or more cold plates and returns the fluid to the IT rack.

In some embodiments, the fluid supply line and/or fluid return line can be channels that are carved out of the frame walls. For example, side walls 116 can be solid walls that have fluid channels carved out of them. Alternatively, or additionally, the fluid supply line and/or fluid return line can be conduits within the frame walls. For example, the side walls can be hollow inside to house conduits that form the fluid supply line and/or fluid return line. The side walls can be vertical walls that stand vertically relative to a bottom wall 132 of the frame. In some embodiments, as shown in FIG. 1, the bottom wall 132 of the frame can be shaped to follow the contact pads if the contact pads extend from the bottom wall. For example, as shown, where the one or more contact pads extend down and away from the bottom wall, the interior surface 124 at the bottom wall also steps down into the contact pad, thereby reducing the thickness of the one or more contact pads 118, which in turn, can reduce the thermal resistance of the one or more contact pads.

One or more contact pads 118 can be arranged on an external surface of the frame, for transferring thermal energy with IT equipment. The one or more contact pads can be joined with the frame through a water-tight seal. In some examples, the one or more contact pads are formed with the frame as a monolithic structure (e.g., formed from a single part), thus reducing the risk of leaks through poorly joined parts. For example, a single block of metal (e.g., aluminum, steel, etc.) can be shaped to form the bottom wall 132 and side walls 116 of the frame. The one or more contact pads can be formed by one or more regions of the bottom wall, such that no joining is required. In some examples, the frame and the contact pads are formed from a common block of metal, for example, through machining, and thus, the contact pads can be formed to a thin layer (e.g., less that 5 mm, less than 2 mm, or less than 1 mm). This can further enhance thermal performance while still fully isolating leaked fluid from the IT equipment.

In some examples, as shown, each contact pad can stand off or protrude from the frame. In other examples, each contact pad can be flush with the frame, providing a smooth bottom surface of the frame. Each of the one or more contact pads can be arranged on a bottom external surface of the frame on the bottom wall 132 of the frame. This bottom external surface can be perpendicular to the one or more vertical walls in which the fluid supply line and fluid return line are held. Thus, the sidewalls 116 and the bottom wall 132 can form a cup shape with internal region 122 serving as a reservoir that can contain fluid if a leak occurs.

A chassis 114, which is not completely shown, can include electronic components 126, which can include high-power processors or other integrated circuits, pancaked onto a PCB 128. The PCB can be mounted onto a tray 134 of the chassis. The chassis can be integrated with and/or fixed to the chassis such that the one or more contact pads are physically pressed against respective electronics. In such a manner, each contact pad can be thermally coupled to the respective electronics. A contact pad can be flat to provide a large and uniform surface area to transfer thermal energy to and from the electronics.

One or more cold plates such as, for example, 102, 104, 106, and 108, can be arranged in an internal region 122 of the frame. The internal region of the frame can be a negative space of the frame, enclosed by sidewalls 116 and a bottom wall on which the one or more contact pads are located at. The one or more cold plates can be thermally connected to an interior surface 124 of the frame at respective positions on the interior surface opposite from the one or more contact pads.

For example, a first cold plate 102 can be assembled to the interior surface of the frame that is directly on top of the first of the one or more contact pads. A second cold plate 104 can be fastened to the interior surface of the frame that is directly on top of the second of the one or more contact pads, and so on. A cold plate can provide localized cooling by transferring heat from a device to a liquid that flows through the cold plate. A cold plate can be a metal structure (for example, a flat plate) that has flow path through the structure. The path of the fluid within the cold plate can have various shape and geometry, for example, a zig-zag, meandering, or back and forth flow path. A cold plate can be assembled to the frame by fastening hardware such as screws, bolts, clips, glue, welding, or other fastening techniques.

The cold plates can include supply lines, return lines, and connectors that are shown collectively here by item 110. The supply lines and return lines of 110 can include flexible hoses or stiff to semi-stiff conduit. The connectors of 110 can connect to one or more fluid supply line connectors and one or more fluid return line connectors of the frame. Those fluid supply line connectors and fluid return line connectors can be arranged and integrated within the internal region of the frame in a sealed manner. As such, these fluid supply line connectors and fluid return line connectors can distribute fluid from the fluid supply line 120 to the one or more cold plates, and collect the fluid from the cold plates and return them to the fluid return line 130. Leaks that occur from the cold plates and components that distribute fluid to and from the cold plates can be contained within internal region 122 of the frame, thereby keeping the IT equipment dry.

Figure 2:
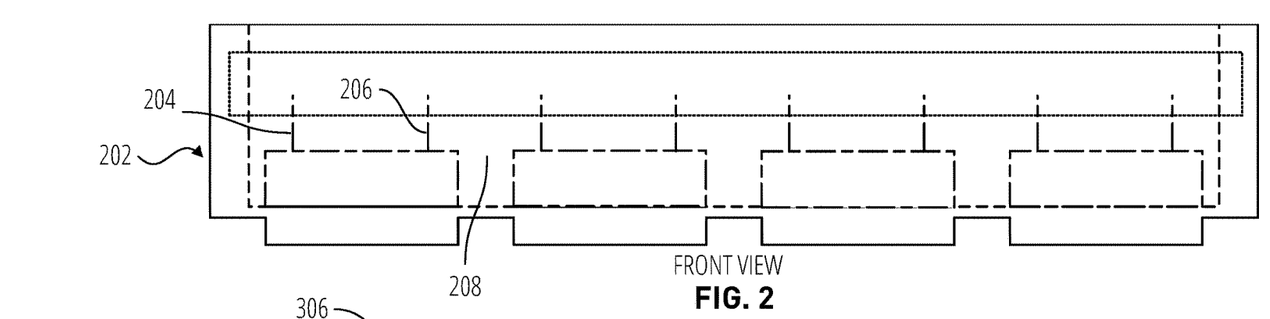
FIG. 2 shows a frame with cold plates for a liquid-cooled chassis in accordance with some embodiments.

FIG. 2 shows a frame 202 with cold plates, which can also be referred to as cooling units, for a liquid-cooled chassis in accordance with some embodiments. In this figure, the entire cooling set, which can include one or more cold plates, as well as the loops and connections for those cold plates, are included within the frame 202. The cold plates are shown as being attached and fastened to the frame, within an internal region 208 of the frame. As described above, each cold plate can have a first line 204 that can include a hose, conduit, and/or connector. The connector of the first line 204 can connect to one or more fluid supply line connectors in the internal region of the frame. Each of the one or more fluid supply line connectors are fluidly connected to the fluid supply line in the frame walls.

Similarly, each cooling unit can have a second line 206 that can include a hose, conduit, and/or connector. The connector of the second line 206 can connect to one or more fluid return line connectors of the frame in the internal region of the frame. Each of the one or more fluid return line connectors are fluidly connected to the fluid return line in the frame walls. In some examples, the connectors of 204 and/or 206 can include blind-mate or quick-disconnect connectors, to allow for simple installation or maintenance of a chassis. If a leak occurs from the cold plates or from any of the connectors, the frame can contain the leak and keep the electronic equipment cool. Cold plate assemblies (including cold plates and their respective lines 204 and 206) can be replaced if leaky or otherwise damaged.

Figure 3:
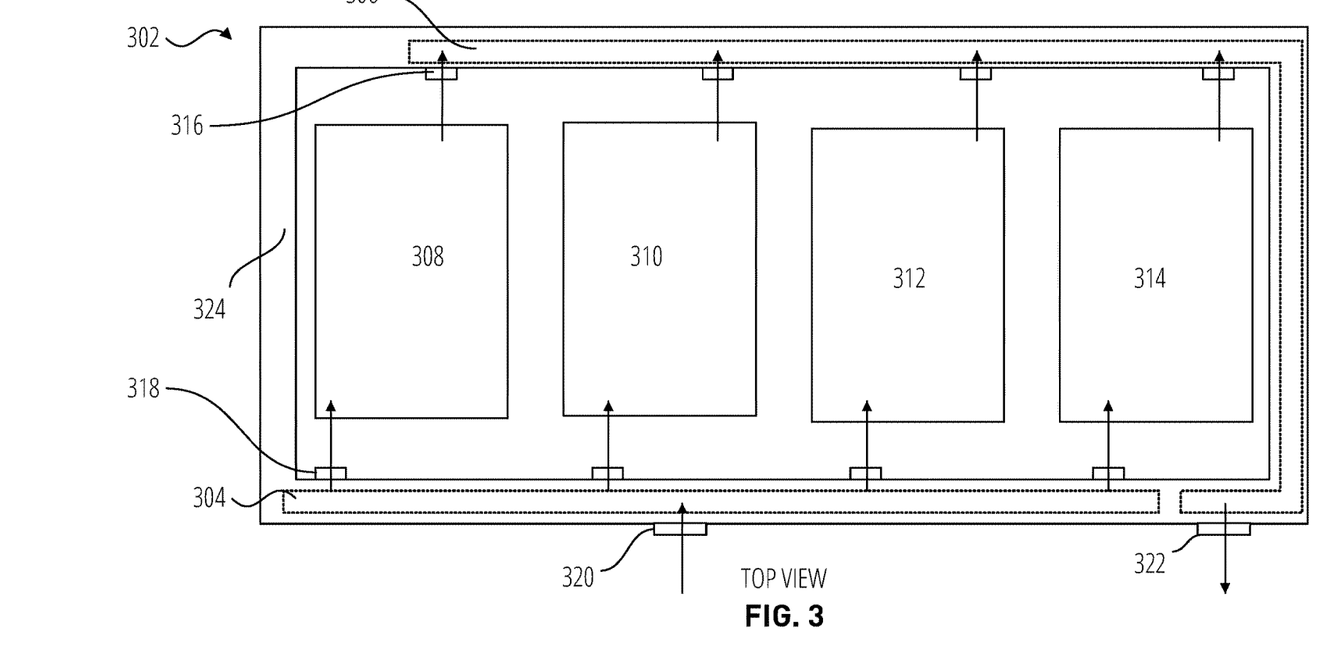
FIG. 3 shows a frame with cold plates in accordance with some embodiments.

FIG. 3 shows a frame 302 with one or more cold plates in accordance with some embodiments. The frame shown here is a top view of a frame, such as, for example, a frame similar or identical to as shown in FIG. 1 or FIG. 2. One or more cold plates such as cold plate 308, 310, 312, and 314 are mounted to a bottom internal surface of the frame, directly above respective contact pads. As mentioned, the cold plates can have lines and connectors that connect to one or more fluid supply line connectors 318 and one or more fluid return line connectors 316. These connectors can be either dripless blind mating and manual mating connectors. In some examples, even if a medium or low quality dripless connector is used with such a frame, the frame can contain small fluid leaks. Thus, such a solution can be used with lower quality connectors if needed. The fluid supply line connectors 318 are fluidly connected to the fluid supply line 304 which resides in the sidewalls 324 of the frame. Similarly, the fluid return lines 316 are fluidly connected to the fluid return line 306 which resides in the sidewalls 324 of the frame. 306 and 304 can be also understood as the fluid distribution units.

Further, although shown as non-overlapping in FIG. 3, the fluid return line and fluid supply line can be arranged at different regions (such as at different heights) along a common section of a sidewall. Additionally, or alternatively, the fluid return line and fluid supply line can occupy different sections of the sidewall, as shown in this example in FIG. 3.

The frame can include an external fluid supply line connector 320 that is also fluidly connected to the supply line 304. The external fluid supply line connector 320 can be arranged at an external surface of the frame. Similarly, the frame can include an external fluid return line connector 322 that is fluidly connected to the fluid return line 306. The external fluid return line connector 322 can be located at an external surface of the frame. As such, the connectors 320 and 322 can be accessible outside of the frame, for receiving and returning fluid from and to an IT rack in which the frame is installed. In some examples, connectors 320 and/or 322 can be fluidly connected to a manifold of an IT rack. As such, a plurality of these frames can be deployed within an IT rack in a flexible manner.

Figure 4:
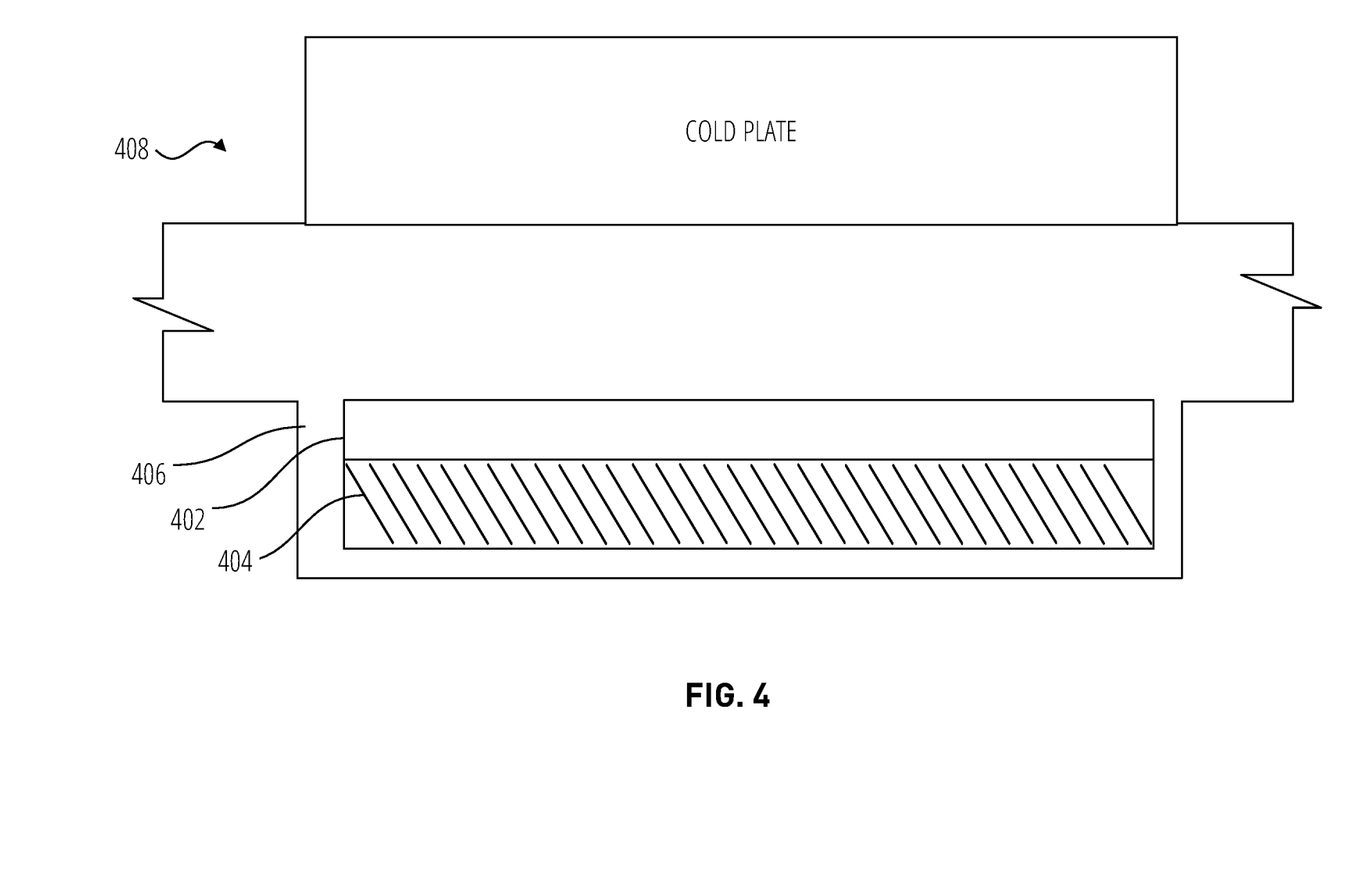
FIG. 4 shows a frame with a built in vaporizing unit, in accordance with some embodiments.

FIG. 4 shows a frame with a built in vaporizing unit, in accordance with some embodiments. A frame 408 can include one or more contact pads 406 arranged at an external surface long a bottom wall of the frame, as described in other sections. The one or more contact pads 406 can include a built in vaporizing fluid 404. For example, a vaporizing fluid 404 can be present in one or more vaporizing chambers 402. When the vaporizing fluid absorbs a certain amount of thermal energy, some of the fluid can change state (e.g., vaporize) from liquid to gas. As the fluid undergoes a phase change, the fluid can absorb latent thermal energy with little to no temperature change. Latent thermal energy of a substance is greater than the specific heat of the same substance. Thus, a contact pad with a build in vaporizing unit can absorb more thermal energy from IT equipment with reduced volume. When the vaporized fluid rises to a top region of the vaporizing chamber 402, the fluid can be cooled by the cold plate, thus condensing the fluid and causing a change back to liquid form. In some embodiments, the vaporizing chamber 402 can be used and assembled underneath the contacting pad 406 rather than inside of the contact pad.

In some examples, although not shown, the vaporizing chamber can include a wicking structure. In some examples, the wicking structure can be located along the bottom floor of the vaporizing chamber to more uniformly distribute the fluid along the floor of the vaporizing chamber.

Examples shown with regard to FIG. 4 can apply to embodiments described in other sections. For example, frames described in the present disclosure with respect to FIG. 1, FIG. 2, FIG. 3, FIG. 5, and/or FIG. 6 can include one or more contact pads with a built in vaporizing unit.

Figure 5:
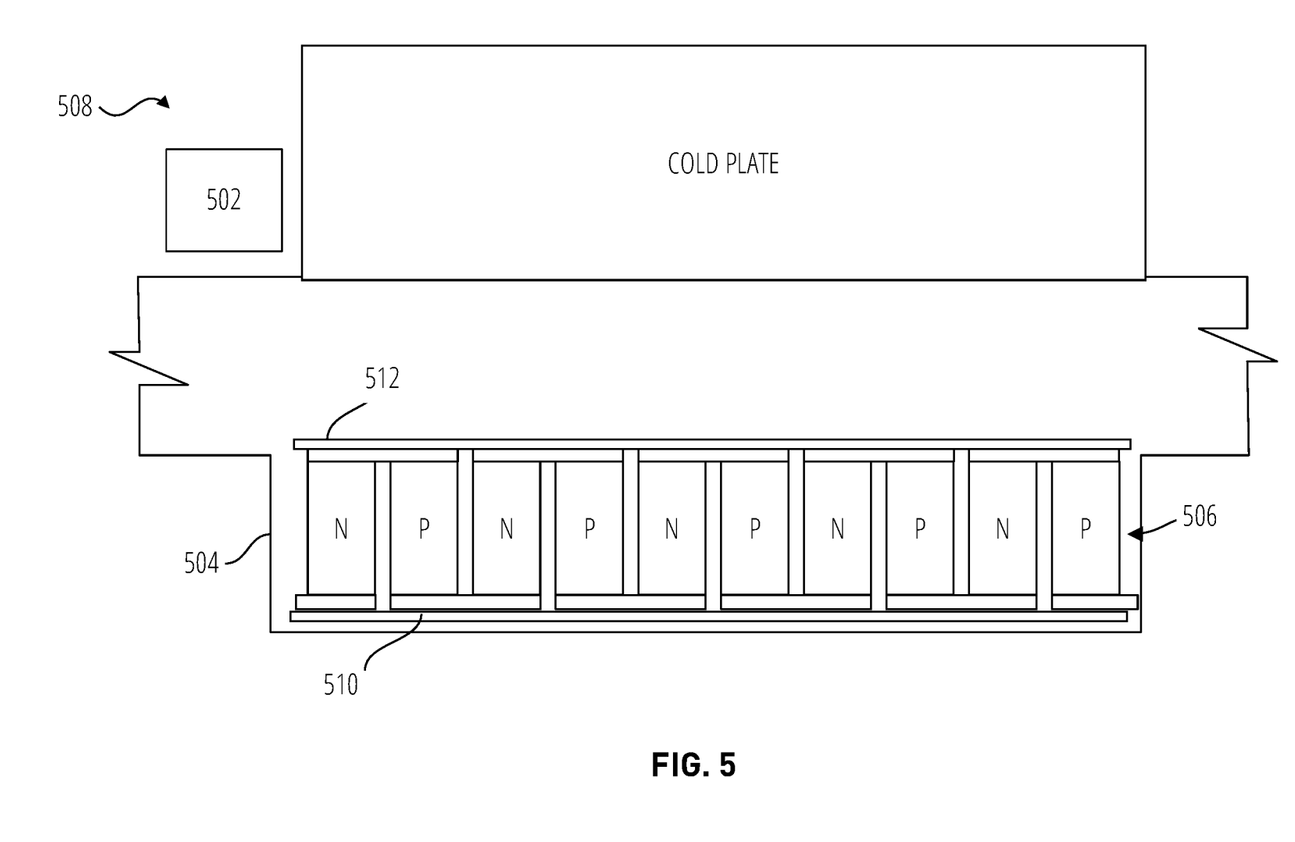
FIG. 5 shows a frame with a thermal electric cooling unit in accordance with some embodiments.

FIG. 5 shows a frame with a thermal electric cooling unit in accordance with some embodiments. A frame 508 can include one or more contact pads 504 arranged at an external surface long a bottom wall of the frame, as described in other sections. The one or more contact pads can include a thermoelectric cooler 506 (TEC). The TEC can include a semi-conductor region (shown by N and P junctions), which can be sandwiched between the hot region and the cold region. The P junctions and N junctions can be electrically connected in series and/or parallel to each other, which can be electrically connected to a power source 502. Each of the hot region 512 and the cold region 510 can be formed by respective plates (planar in shape) that sandwich the semi-conductor region on opposite sides, with the cold region facing towards the exterior surface of the frame. The TEC, which is also known as a Peltier module, can have the semiconductor components arranged to produce electricity through the Peltier effect, Seebeck effect, and/or Thomson effect. In some embodiments, TEC 506 can be arranged underneath the contact pad 504 rather than inside the contact pad.

Power source 502 can provide a voltage (e.g., a DC voltage) to the TEC, which causes thermal energy to actively flow from the cold side to the hot side 512. The cold plate which is mounted to the interior surface of the frame can absorb thermal energy from the hot side. Thus, thermal energy can be transferred from the IT equipment actively should the need arise. Power source 502 can be activated by processing logic that can be implemented as hardware (e.g., a processor or programmable logic), software, or a combination thereof.

In some examples, processing logic can activate the power source to actively cool the one or more contact pads based on a sensed temperature. The temperature of the frame and/or IT equipment can be sensed and, if a threshold is satisfied, the power source can be activated. In some examples, the voltage output of the power source can be proportionally controlled based on the temperature. For example, the hotter the temperature, the higher the processing logic drives the voltage source, within some temperature or voltage limit.

According to some aspects, the frame can introduce additional thickness of material between the cold plates and each IT equipment as compared to a direct contact between the cold plates and the respective IT equipment. For example, based on the thickness of the bottom wall of the frame and/or the height in which the contact pads stand off from the frame, the distance that thermal energy must travel from the IT equipment to the cold plate can increase. This effect, however, can be balanced with the benefit of a more reliable and leak-resistant system. Further, some examples such as those shown in FIG. 4 or FIG. 5 can reduce the thermal resistance caused by the thickness of the frame, and enhance the heat transfer from the source to the cooling unit.

Figure 6:
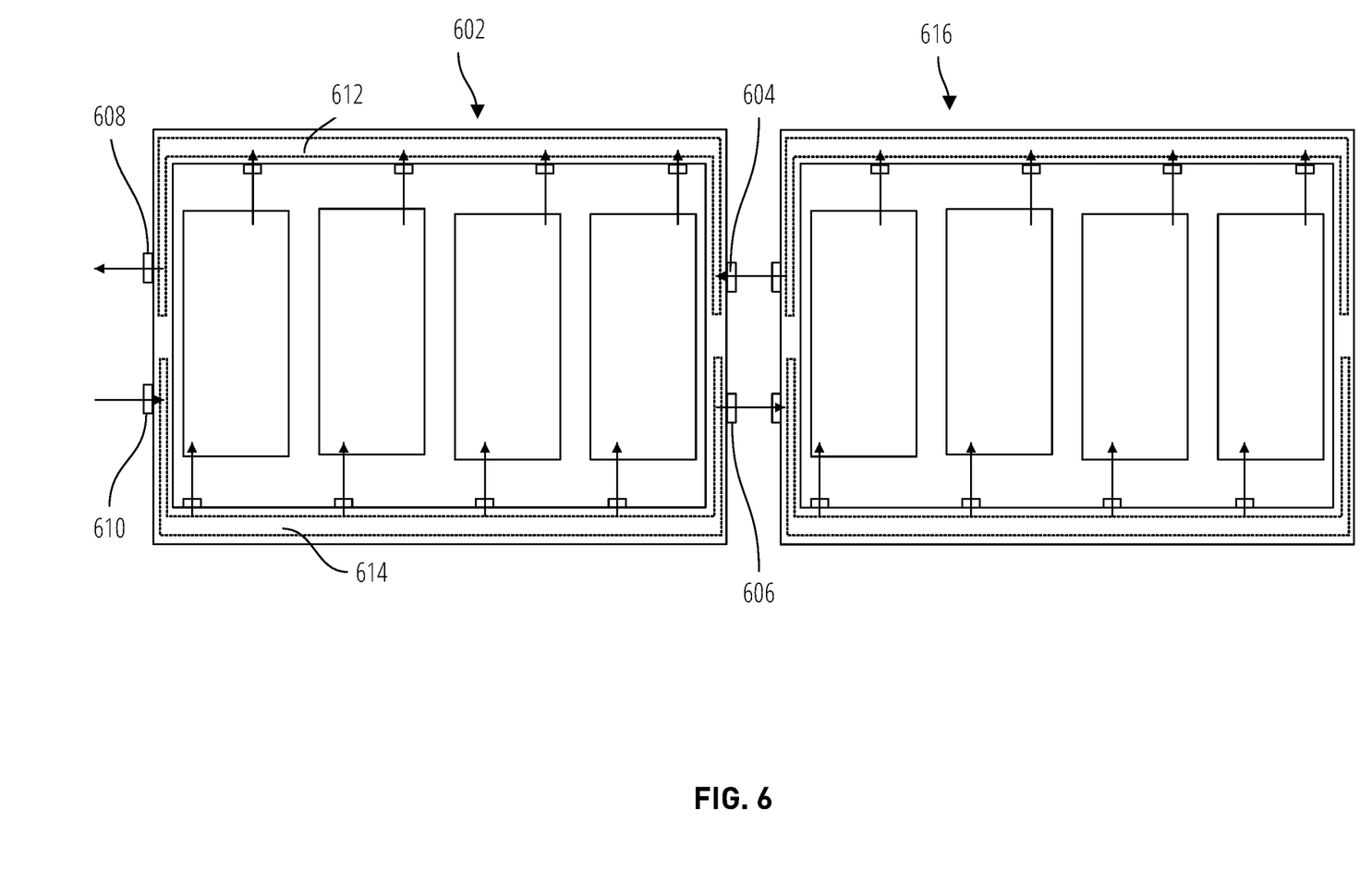
FIG. 6 shows frames with shared fluid in accordance with some embodiments.

FIG. 6 shows frames with shared fluid in accordance with some embodiments. A frame 602 can have an external fluid supply line connector 610 and an external fluid return line connector 608 for receiving and returning fluid from and to the IT rack. This can be referred to as rack level fluid. In some examples, as described in other sections, the external fluid supply and return line connectors 610 and 608 can be fluidly connected to a manifold of the IT rack. The external fluid supply line connector 610 can fluidly connect to a supply line 612 that is within the sidewalls of the frame 602. The external fluid return line 608 can fluidly connect to a return line 614 that is within the sidewalls of the frame 602.

In addition, the frame 602 can have an additional fluid supply line connector 606 and additional fluid return line connector 604. The additional fluid supply line connector 606 can also be fluidly connected to supply line 614. Similarly, the additional fluid return line connector 604 can also be fluidly connected to return line 612. The connectors 608, 610, 604, and 606 can be located on external surfaces of the frame. The additional connectors 604 and 606 can be connected to a second frame 616, such as through the second frame's external fluid supply line connector and external fluid return line connector, for fluidly connecting the frame 602 to the second frame 616.

The frame 602 and the second frame 616 can be fixed to and/or integrated with a common chassis. As such, the frames can be flexibly arranged to suit different arrangements on various chassis. The sharing of fluid from one frame to another can reduce the number of hoses, conduit, and connections throughout an IT rack, thereby reducing potential sources for leaks.

Figure 7:
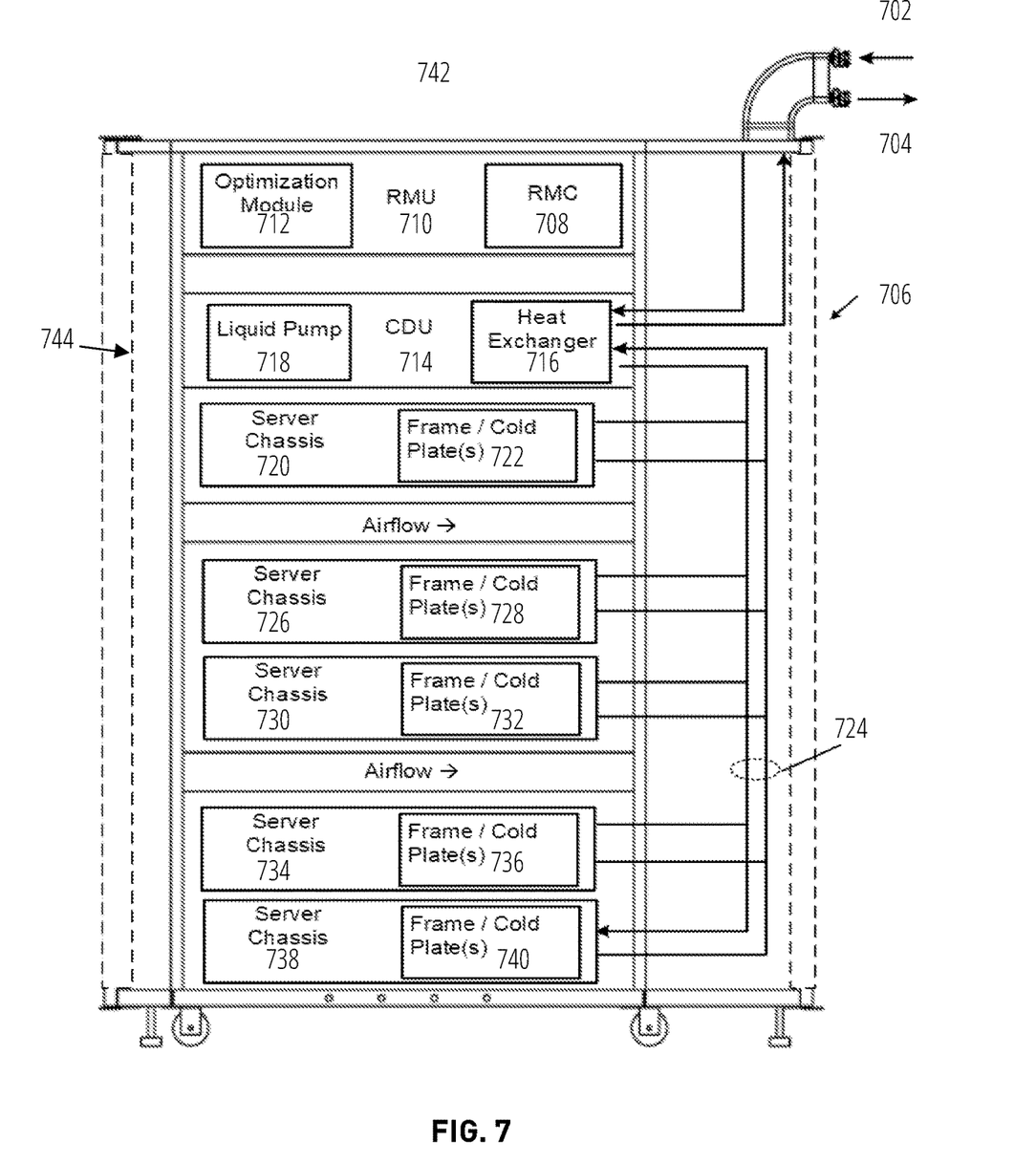
FIG. 7 is block diagram illustrating an IT rack according to one embodiment.

FIG. 7 is block diagram illustrating an IT rack, which can also be referred to as an electronic rack, according to some embodiments. IT rack 742 may represent any of the IT racks as described throughout this application. According to one embodiment, IT rack 742 includes, but is not limited to, coolant distribution unit (CDU) 714, rack management unit (RMU) 710, and one or more server chassis such as server chassis 720, 726, 730, 734, and 738. The one or more server chassis can be inserted into an array of server slots (e.g., standard shelves) respectively from frontend 744 or backend 706 of the rack. Note that although there are five server chassis shown in this example, more or fewer server chassis may be maintained within an IT rack. Also note that the particular positions of the CDU, the RMU, and/or the one or more server chassis are shown for the purpose of illustration only; other arrangements or configurations of the CDU, the RMU, and/or the one or more server chassis may also be implemented. In one embodiment, the IT rack can be either open to the environment or partially contained by a rack container, as long as the cooling fans can generate airflows from the frontend to the backend.

Any or all of the server chassis can each include one or more frames that house respective cold plates, shown collectively here has 722, 728, 732, 736, and 740. Each of the one or more frames and respective cold plates can include embodiments described in other sections. In some examples, as described, a server chassis may have more than one frame installed upon the IT equipment. One frame can provide fluid to another frame, and so on. In some examples, a frame can include a vapor unit or a TEC, as described in other sections. A server chassis can be populated with different frames based on application.

In addition, for at least some of the server chassis, an optional fan module (not shown) is associated with the server chassis. Each of the fan modules includes one or more cooling fans. The fan modules may be mounted on the backends of server chassis or on the electronic rack to generate airflows flowing from frontend, traveling through the air space of the sever chassis, and existing at backend of electronic rack.

In one embodiment, CDU mainly includes heat exchanger 716, liquid pump 718, and a pump controller (not shown), and some other components such as a liquid reservoir, a power supply, monitoring sensors and so on. Heat exchanger 716 may be a liquid-to-liquid heat exchanger. Heat exchanger 716 can include a first loop with inlet and outlet ports having a first pair of liquid connectors coupled to external liquid supply/return lines 702, 704 to form a primary loop. The connectors coupled to the external liquid supply/return lines 702, 704 may be disposed or mounted on the backend of electronic rack. The liquid supply/return lines, which can also be referred to as room liquid supply/return lines, may be coupled to an external cooling system.

In addition, heat exchanger 716 can further include a second loop with two ports having a second pair of liquid connectors coupled to liquid manifold 724 (also referred to as a rack manifold) to form a secondary loop, which may include a supply manifold (also referred to as a rack liquid supply line or rack supply manifold) to supply cooling liquid to any of the one or more server chassis and a return manifold (also referred to as a rack liquid return line or rack return manifold) to return warmer liquid back to CDU 714. Note that CDUs 714 can be any kind of CDUs commercially available or customized ones. Thus, the details of CDUs will not be described herein.

Each of the server chassis may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. A server chassis may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

The IT rack can further include an optional RMU 710 configured to provide and manage power supplied to the servers, and the CDU. The RMU may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 1200.

The rack configuration as shown is described for the purpose of illustration only; other configurations or arrangements may also be applicable. For example, the CDU may be an optional unit. The cold plates of server chassis may be coupled to a rack manifold, which may be directly coupled to an external liquid cooling system (e.g., through a room manifold) without using a CDU. Although not shown, a power supply unit may be disposed within the electronic rack. The power supply unit may be implemented as a standard chassis identical or similar to a sever chassis, where the power supply chassis can be inserted into any of the standard shelves, replacing any of the server chassis. In addition, the power supply chassis may further include a battery backup unit (BBU) to provide battery power to one or more of the server chassis when the main power is unavailable. The BBU may include one or more battery packages and each battery package include one or more battery cells, as well as the necessary charging and discharging circuits for charging and discharging the battery cells.

It should be understood that some features described and shown in the drawings can vary without departing from the scope of the disclosure. For example, as described, the contact pads can have varying stand-off height (e.g., 0 mm, 1 mm, 2 mm, 5 mm, or other height). Further, although shown has having four side walls that form a rectangular shape from the top view, the frame can have varying shape or geometry without departing from the scope of the present disclosure.

Some embodiments may include a non-transitory machine-readable medium (such as microelectronic memory) having stored thereon instructions, which program one or more data processing components (generically referred to here as a "processor") to perform operations, such as control of a power source for TEC. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A frame for a liquid-cooled chassis in an information technology (IT) rack, comprising:
    a fluid supply line contained within a first hollow portion of a sidewall of the frame, the fluid supply line to deliver fluid from the IT rack to one or more cold plates in the frame;
    a fluid return line contained within a second hollow portion of the sidewall of the frame, the fluid return line to collect the fluid from the one or more cold plates and return the fluid to the IT rack;
    one or more fluid supply line connectors and one or more fluid return line connectors, wherein each of the one or more fluid supply line connectors and each of the one or more fluid return line connectors is arranged along and attached to the sidewall of the frame and faces towards an inside portion of the frame, wherein the one or more fluid supply line connectors and the one or more fluid return line connectors fluidly connect with and distribute fluid to and from the one or more cold plates; and
    one or more contact pads arranged on an external surface of the frame, for transferring thermal energy with IT equipment.

2. The frame of claim 1, wherein the one or more cold plates are arranged in an internal region of the frame and are thermally connected to an interior surface of the frame at respective positions on the interior surface opposite from the one or more contact pads.

3. The frame of claim 1, wherein the one or more contact pads are arranged on a bottom external surface of the frame.

4. The frame of claim 1, wherein the frame is a water-sealed frame to contain leaked fluid in an internal region of the frame, fully segregating the fluid from electronics of the IT equipment.

5. The frame of claim 1, wherein a thermoelectric cooler is built within or attached to the one or more contact pads.

6. The frame of claim 1, wherein a vaporizing fluid is housed in a chamber that is built within or attached to the one or more contact pads.

7. The frame of claim 1, wherein the frame has an external fluid supply line connector and an external fluid return line connector for receiving and returning fluid from and to a manifold of the IT rack.

8. The frame of claim 1, wherein the frame has an additional fluid supply line connector and additional fluid return line connector for fluidly connecting the frame to a second frame within the liquid-cooled chassis.

9. A liquid-cooled chassis in an information technology (IT) rack, comprising:
    IT equipment housed in the liquid-cooled chassis; and
    a frame, comprising:
    a fluid supply line contained within a first hollow portion of a sidewall of the frame, the fluid supply line to deliver fluid from the IT rack to one or more cold plates in the frame;
    a fluid return line contained within a second hollow portion of the sidewall of the frame, the fluid return line to collect the fluid from the one or more cold plates and return the fluid to the IT rack;
    one or more fluid supply line connectors and one or more fluid return line connectors, wherein each of the one or more fluid supply line connectors and each of the one or more fluid return line connectors is arranged along and attached to the sidewall of the frame and faces towards an inside portion of the frame, wherein the one or more fluid supply line connectors and the one or more fluid return line connectors fluidly connect with and distribute fluid to and from the one or more cold plates; and
    one or more contact pads arranged on an external surface of the frame, for transferring thermal energy with the IT equipment.

10. The liquid-cooled chassis of claim 9, wherein the one or more cold plates are arranged in an internal region of the frame and are thermally connected to an interior surface of the frame at respective positions on the interior surface opposite from the one or more contact pads.

11. The liquid-cooled chassis of claim 9, wherein the one or more contact pads are arranged on a bottom external surface of the frame.

12. The liquid-cooled chassis of claim 9, wherein the frame is a water-sealed frame to contain leaked fluid in an internal region of the frame, fully segregating the fluid from electronics of the IT equipment.

13. The liquid-cooled chassis of claim 9, wherein a thermoelectric cooler is built within or attached to the one or more contact pads.

14. The liquid-cooled chassis of claim 9, wherein a vaporizing fluid is housed in a chamber that is built within or attached to the one or more contact pads.

15. The liquid-cooled chassis of claim 9, wherein the frame has an external fluid supply line connector and an external fluid return line connector for receiving and returning fluid from and to a manifold of the IT rack.

16. An electronic rack, comprising:
a plurality of server chassis arranged in a stack, wherein each of the server chassis comprises:
  information technology (IT) equipment housed in the chassis; and
  a frame, comprising:
    a fluid supply line contained within a first hollow portion of a sidewall of the frame, the fluid supply line to deliver fluid from the IT rack to one or more cold plates in the frame;
    a fluid return line contained within a second hollow portion of the sidewall of the frame, the fluid return line to collect the fluid from the one or more cold plates and return the fluid to the IT rack;
    one or more fluid supply line connectors and one or more fluid return line connectors, wherein each of the one or more fluid supply line connectors and each of the one or more fluid return line connectors is arranged along and attached to the sidewall of the frame and faces towards an inside portion of the frame, wherein the one or more fluid supply line connectors and the one or more fluid return line connectors fluidly connect with and distribute fluid to and from the one or more cold plates; and
  one or more contact pads arranged on an external surface of the frame, for transferring thermal energy with the IT equipment.

17. The electronic rack of claim 16, wherein the one or more cold plates are arranged in an internal region of the frame and are thermally connected to an interior surface of the frame at respective positions on the interior surface opposite from the one or more contact pads.

\* \* \* \* \*